(12) United States Patent
Huang

(10) Patent No.: US 11,715,398 B2
(45) Date of Patent: Aug. 1, 2023

(54) MEASUREMENT SIGNAL CIRCUIT AND MEASUREMENT METHOD THEREOF

(71) Applicant: HKC CORPORATION LIMITED, Shenzhen (CN)

(72) Inventor: Xiaoyu Huang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 213 days.

(21) Appl. No.: 17/272,657

(22) PCT Filed: Jan. 18, 2019

(86) PCT No.: PCT/CN2019/072283
§ 371 (c)(1),
(2) Date: Mar. 2, 2021

(87) PCT Pub. No.: WO2020/093598
PCT Pub. Date: May 14, 2020

(65) Prior Publication Data
US 2021/0343206 A1    Nov. 4, 2021

(30) Foreign Application Priority Data

Nov. 9, 2018  (CN) .......................... 201811331480.4

(51) Int. Cl.
*G09G 3/36* (2006.01)
*G09G 3/00* (2006.01)
*H10K 59/121* (2023.01)

(52) U.S. Cl.
CPC ........... *G09G 3/006* (2013.01); *G09G 3/3674* (2013.01); *G09G 3/3685* (2013.01);
(Continued)

(58) Field of Classification Search
CPC .... G09G 3/006; G09G 3/3674; G09G 3/3685; G09G 2230/00; G09G 2310/02; G09G 2330/12; G09G 3/066; H01L 27/3262
(Continued)

(56) References Cited

U.S. PATENT DOCUMENTS 9,257,068 B2    2/2016  Kim et al.
2008/0007504 A1*  1/2008  Kawaura ................ G09G 3/006
345/904
(Continued)

FOREIGN PATENT DOCUMENTS

CN    101877582 A    11/2010
CN    101958093 A    1/2011
(Continued)

OTHER PUBLICATIONS

Yapei Zhou, the International Searching Authority written comments, dated Aug. 2019, CN.
(Continued)

*Primary Examiner* — Abdul-Samad A Adediran

(57) ABSTRACT

This application provides a measurement signal circuit and a measurement method thereof. The measurement signal circuit includes: a first switch, the first switch being electrically coupled to a first node, a second node and a third node; a second switch, a control end of the second switch being electrically coupled to the first node, a first end of the second switch being electrically coupled to a fourth node, and a second end of the second switch being electrically coupled to the third node; and a third switch, a control end of the third switch being electrically coupled to a fifth node, a first end of the third switch being electrically coupled to the third node, and a second end of the third switch being electrically coupled to a pad.

11 Claims, 3 Drawing Sheets

(52) U.S. Cl.
CPC ..... *H10K 59/1213* (2023.02); *G09G 2230/00* (2013.01); *G09G 2310/02* (2013.01); *G09G 2330/12* (2013.01)

(58) Field of Classification Search
USPC ...................................... 345/47, 904; 349/47
See application file for complete search history.

(56) References Cited

U.S. PATENT DOCUMENTS

| | | | |
|---|---|---|---|
| 2015/0077681 A1* | 3/2015 | Li | G09G 3/006 349/47 |
| 2016/0071446 A1 | 3/2016 | Miyake | |

FOREIGN PATENT DOCUMENTS

| | | |
|---|---|---|
| CN | 101963629 A | 2/2011 |
| CN | 102636928 A | 8/2012 |
| CN | 103345914 A | 10/2013 |
| CN | 104992651 A | 10/2015 |

OTHER PUBLICATIONS

Yapei Zhou, the International Searching Report, dated Aug. 2019, CN.

* cited by examiner

```
┌─────────────────────────────────────────────────────────────────────┐
│ Provide a first switch, a control end of the first switch being     │─ S311
│ electrically coupled to a first node, a first end of the first      │
│ switch being electrically coupled to a second node, and a second    │
│ end of the first switch being electrically coupled to a third node  │
└─────────────────────────────────────────────────────────────────────┘
                                  ↓
┌─────────────────────────────────────────────────────────────────────┐
│ Provide a second switch, a control end of the second switch being   │─ S312
│ electrically coupled to the first node, a first end of the second   │
│ switch being electrically coupled to a fourth node, and a second    │
│ end of the second switch being electrically coupled to the third    │
│ node                                                                │
└─────────────────────────────────────────────────────────────────────┘
                                  ↓
┌─────────────────────────────────────────────────────────────────────┐
│ Provide a third switch, a control end of the third switch being     │─ S313
│ electrically coupled to a fifth node, a first end of the third      │
│ switch being electrically coupled to the third node, and a second   │
│ end of the third switch being electrically coupled to a pad         │
└─────────────────────────────────────────────────────────────────────┘
                                  ↓
┌─────────────────────────────────────────────────────────────────────┐
│ Provide a fourth switch, a control end of the fourth switch being   │─ S314
│ electrically coupled to the fifth node, a first end of the fourth   │
│ switch being electrically coupled to a data line, and a second end  │
│ of the fourth switch being electrically coupled to the second node  │
└─────────────────────────────────────────────────────────────────────┘
                                  ↓
┌─────────────────────────────────────────────────────────────────────┐
│ Provide a fifth switch, a control end of the fifth switch being     │─ S315
│ electrically coupled to the fifth node, a first end of the fifth    │
│ switch being electrically coupled to a scanning line, and a second  │
│ end of the fifth switch being electrically coupled to the fourth    │
│ node                                                                │
└─────────────────────────────────────────────────────────────────────┘
                                  ↓
┌─────────────────────────────────────────────────────────────────────┐
│ Provide a flip-flop, a first end of the flip-flop being             │─ S316
│ electrically coupled to a first voltage signal, a second end of the │
│ flip-flop being electrically coupled to a frequency input signal,   │
│ and a third end of the flip-flop being electrically coupled to the  │
│ first node                                                          │
└─────────────────────────────────────────────────────────────────────┘
                                  ↓
┌─────────────────────────────────────────────────────────────────────┐
│ Provide a first resistor, one end of the first resistor being       │─ S317
│ electrically coupled to the first node, and the other end of the    │
│ first resistor being electrically grounded                          │
└─────────────────────────────────────────────────────────────────────┘
                                  ↓
┌─────────────────────────────────────────────────────────────────────┐
│ Provide a second resistor, one end of the second resistor being     │
│ electrically coupled to a second voltage signal, and the other end  │
│ of the second resistor being electrically grounded                  │
└─────────────────────────────────────────────────────────────────────┘
                                                                   S318
                                  ↓
┌─────────────────────────────────────────────────────────────────────┐
│ Measure a waveform signal of the scanning line through              │─ S319
│ a connection between the pad and the scanning line                  │
└─────────────────────────────────────────────────────────────────────┘
                                  ↓
┌─────────────────────────────────────────────────────────────────────┐
│ Measure a waveform signal of the data line through                  │─ S320
│ a connection between the pad and the data line                      │
└─────────────────────────────────────────────────────────────────────┘
                                  ↓
┌─────────────────────────────────────────────────────────────────────┐
│ Electrically couple the other end of the second resistor to         │─ S321
│ the fifth node if the other end is not electrically grounded        │
└─────────────────────────────────────────────────────────────────────┘
```

FIG. 3

//MEASUREMENT SIGNAL CIRCUIT AND MEASUREMENT METHOD THEREOF

This application claims the priority to Chinese patent application No. 201811331480.4, filed with the National Intellectual Property Administration, PRC on Nov. 9, 2018 entitled "MEASUREMENT SIGNAL CIRCUIT AND MEASUREMENT METHOD THEREOF", which is incorporated herein by reference in its entirety.

TECHNICAL FIELD

This application relates to the display field, and in particular, to a measurement signal circuit and a measurement method thereof.

BACKGROUND

The statements herein only provide background information related to this application, and do not necessarily constitute the prior art.

A thin film transistor liquid crystal display (TFT-LCD) is currently one of main types of current tablet computer displays, and has become an important display platform in modern information technologies and video products. A main driving principle of the TFT-LCD is as follows: a system mainboard connects a compressed signal, a control signal, and a power supply of a red/green/blue pixel to a connector on a printed circuit board through a wire, so that after being processed by a timing controller (TCON) chip on the printed circuit board, data is connected to a display area through a source chip on film (S-COF) and a gate chip on film (G-COF), and a voltage is transmitted through a data line and a scan line on the array substrate. In this way, a display panel can implement a display function.

Due to specified capacitance and resistance in wiring on the array substrate, signals are distorted after being transmitted by the data line and the scan line. During product development and subsequent analysis, an attenuated voltage signal that passes through the data line and scan line on the array substrate usually needs to be measured. In actual applications, because ends of the data line and the scan line are located on an edge of glass, the attenuated voltage signal can be measured only after the glass is broken. This method is time-consuming, and a product is destroyed after the glass is broken, resulting in a waste. In addition, splinters cause the liquid crystal to volatilize, which is harmful to human health after inhalation.

SUMMARY

An objective of this application is to provide a measurement signal circuit, including: a first switch, a control end of the first switch being electrically coupled to a first node, a first end of the first switch being electrically coupled to a second node, and a second end of the first switch being electrically coupled to a third node; a second switch, a control end of the second switch being electrically coupled to the first node, a first end of the second switch being electrically coupled to a fourth node, and a second end of the second switch being electrically coupled to the third node; and a third switch, a control end of the third switch being electrically coupled to a fifth node, a first end of the third switch being electrically coupled to the third node, and a second end of the third switch being electrically coupled to a pad.

In one or more embodiments, the measurement signal circuit further includes a fourth switch, a control end of the fourth switch being electrically coupled to the fifth node, a first end of the fourth switch being electrically coupled to a data line, and a second end of the fourth switch being electrically coupled to the second node.

In one or more embodiments, the measurement signal circuit further includes a fifth switch, a control end of the fifth switch being electrically coupled to the fifth node, a first end of the fifth switch being electrically coupled to a scan line, and a second end of the fifth switch being electrically coupled to the fourth node.

In one or more embodiments, the measurement signal circuit further includes a trigger, a first end of the trigger being electrically coupled to a first voltage signal, a second end of the trigger being electrically coupled to a frequency input signal, and a third end of the trigger being electrically coupled to the first node.

In one or more embodiments, the measurement signal circuit further includes a first resistor, one end of the first resistor being electrically coupled to the first node, and the other end of the first resistor being electrically grounded.

In one or more embodiments, the measurement signal circuit further includes a second resistor, one end of the second resistor being electrically coupled to a second voltage signal, and the other end of the second resistor being electrically grounded.

Another objective of this application is to provide a measurement signal circuit, including: a first switch, a control end of the first switch being electrically coupled to a first node, a first end of the first switch being electrically coupled to a second node, and a second end of the first switch being electrically coupled to a third node; a second switch, a control end of the second switch being electrically coupled to the first node, a first end of the second switch being electrically coupled to a fourth node, and a second end of the second switch being electrically coupled to the third node; a third switch, a control end of the third switch being electrically coupled to a fifth node, a first end of the third switch being electrically coupled to the third node, and a second end of the third switch being electrically coupled to a pad; a fourth switch, a control end of the fourth switch being electrically coupled to the fifth node, a first end of the fourth switch being electrically coupled to a data line, and a second end of the fourth switch being electrically coupled to the second node; a fifth switch, a control end of the fifth switch being electrically coupled to the fifth node, a first end of the fifth switch being electrically coupled to a scan line, and a second end of the fifth switch being electrically coupled to the fourth node; a first resistor, one end of the first resistor being electrically coupled to the first node, and the other end of the first resistor being electrically grounded, and a second resistor, one end of the second resistor being electrically coupled to a second voltage signal, and the other end of the second resistor being electrically grounded, where the other end of the second resistor is electrically coupled to the fifth node if the other end is not electrically grounded.

In one or more embodiments, the measurement signal circuit further includes a trigger, a first end of the trigger being electrically coupled to a first voltage signal, a second end of the trigger being electrically coupled to a frequency input signal, and a third end of the trigger being electrically coupled to the first node.

In one or more embodiments, a waveform signal of the scan line is measured through a connection between the pad and the scan line.

In one or more embodiments, during the measuring a waveform signal of the scan line, the electrically grounded other end of the second resistor is cut off by using a laser, and the other end of the second resistor is electrically coupled to the fifth node, so that a gate control signal of each of the third switch, the fourth switch, and the fifth switch is a high-level signal, and the third switch, the fourth switch, and the fifth switch are turned on.

In one or more embodiments, during the measuring a waveform signal of the scan line, the first resistor is grounded, so that a gate control signal of each of the first switch and the second switch is a low-level signal, and the first switch is turned off and the second switch is turned on.

In one or more embodiments, during the measuring a waveform signal of the scan line, the waveform signal of the scan line is measured through the pad.

In one or more embodiments, a waveform signal of the data line is measured through a connection between the pad and the data line.

In one or more embodiments, during the measuring a waveform signal of the data line, a signal is transmitted to the trigger, so that a gate control signal of each of the first switch and the second switch is a high-level signal, and the first switch is turned on and the second switch is turned off.

In one or more embodiments, during the measuring a waveform signal of the data line, the waveform signal of the data line is measured through the pad.

Still another objective of this application is to provide a measurement method for a measurement signal circuit, including:

providing a first switch, a control end of the first switch being electrically coupled to a first node, a first end of the first switch being electrically coupled to a second node, and a second end of the first switch being electrically coupled to a third node;

providing a second switch, a control end of the second switch being electrically coupled to the first node, a first end of the second switch being electrically coupled to a fourth node, and a second end of the second switch being electrically coupled to the third node;

providing a third switch, a control end of the third switch being electrically coupled to a fifth node, a first end of the third switch being electrically coupled to the third node, and a second end of the third switch being electrically coupled to a pad;

providing a fourth switch, a control end of the fourth switch being electrically coupled to the fifth node, a first end of the fourth switch being electrically coupled to a data line, and a second end of the fourth switch being electrically coupled to the second node:

providing a fifth switch, a control end of the fifth switch being electrically coupled to the fifth node, a first end of the fifth switch being electrically coupled to a scan line, and a second end of the fifth switch being electrically coupled to the fourth node;

providing a trigger, a first end of the trigger being electrically coupled to a first voltage signal, a second end of the trigger being electrically coupled to a frequency input signal, and a third end of the trigger being electrically coupled to the first node:

providing a first resistor, one end of the first resistor being electrically coupled to the first node, and the other end of the first resistor being electrically grounded;

providing a second resistor, one end of the second resistor being electrically coupled to a second voltage signal, and the other end of the second resistor being electrically grounded;

measuring a waveform signal of the scan line through a connection between the pad and the scan line;

and measuring a waveform signal of the data line through a connection between the pad and the data line, where the other end of the second resistor is electrically coupled to the fifth node if the other end is not electrically grounded.

This application provides a circuit and a measurement method that can quickly measure required signals as required without affecting product performance. In addition, additional device costs are not increased, and damage to the human body during glass breaking is eliminated.

BRIEF DESCRIPTION OF DRAWINGS

FIG. 3 is a flowchart of a measurement method for a measurement signal circuit according to an embodiment of this application.

DETAILED DESCRIPTION OF EMBODIMENTS

Figure 1:
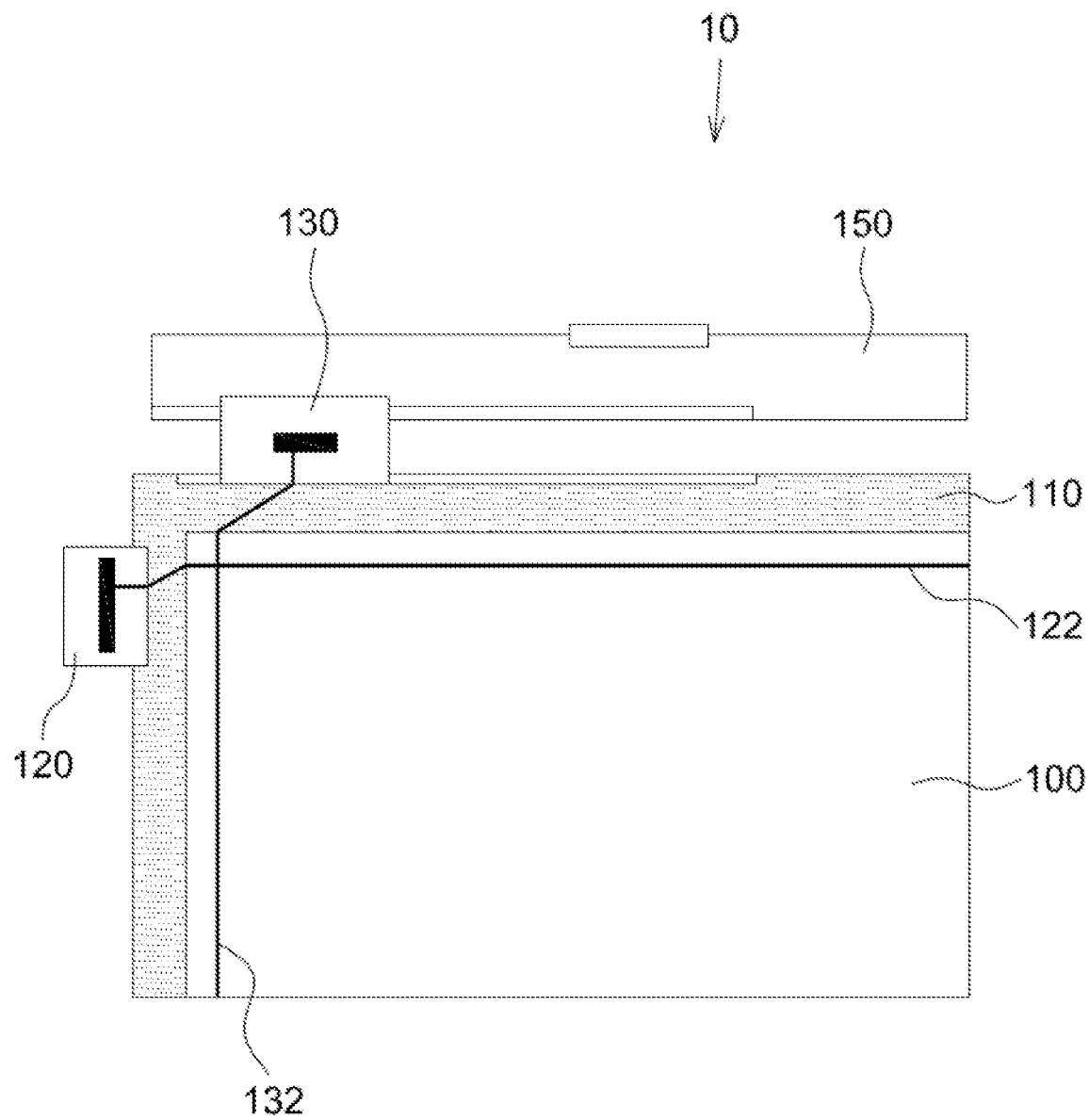
FIG. 1 is a schematic diagram of an exemplary liquid crystal display.

The following description of various embodiments is provided to exemplify the specific embodiments of this application with reference to accompanying drawings. The directional terms mentioned in this application, such as "above", "below", "front", "back", "left", "right", "in", "out", and "side", merely refer to the directions in the accompanying drawings. Therefore, the used direction terms are intended to describe and understand this application, but are not intended to limit this application.

The accompanying drawings and specification are essentially considered as exemplary, but not limited. In the drawings, similar structures are denoted by the same reference numbers. In addition, for understanding and ease description, the size and thickness of each component shown in the drawings are arbitrarily shown, but this application is not limited thereto.

In the accompanying drawings, for clarity, the thickness of layers, films, panels, regions, and the like are exaggerated. In the accompanying drawings, for understanding and ease description, the thickness of some layers and regions are exaggerated. It is to be understood that, when component such as a layer, a film, a region, or a substrate is referred to as being "on" another component, the component may be directly on the other component, or an intermediate component may exist.

In addition, in the specification, unless explicitly described as contrary, the word "include" is understood as referring to including the component, but does not exclude any other components. In addition, in the specification, "above" refers to being located above or below the target component, and does not refer to being located on the top based on the direction of gravity.

In order to further explain technical means and effects adopted in this application to achieve the intended purposes of this application, specific implementations, structures, characteristics, and effects of a measurement signal circuit and a measurement method thereof provided in this application are described in detail below with reference to the drawings and specific embodiments.

FIG. 1 is a schematic diagram of an exemplary liquid crystal display.

Referring to FIG. 1, an exemplary liquid crystal display 10 includes a color filter substrate 100, an array substrate 110, a gate chip on film 120, a source chip on film 130, and a printed circuit board 150. The array substrate 110 is provided with a plurality of scan lines 122 and a plurality of data lines 132, the scan lines 122 being electrically coupled to the gate chip on film 120, and the data lines 132 being electrically coupled to the source chip on film 130.

Figure 2:
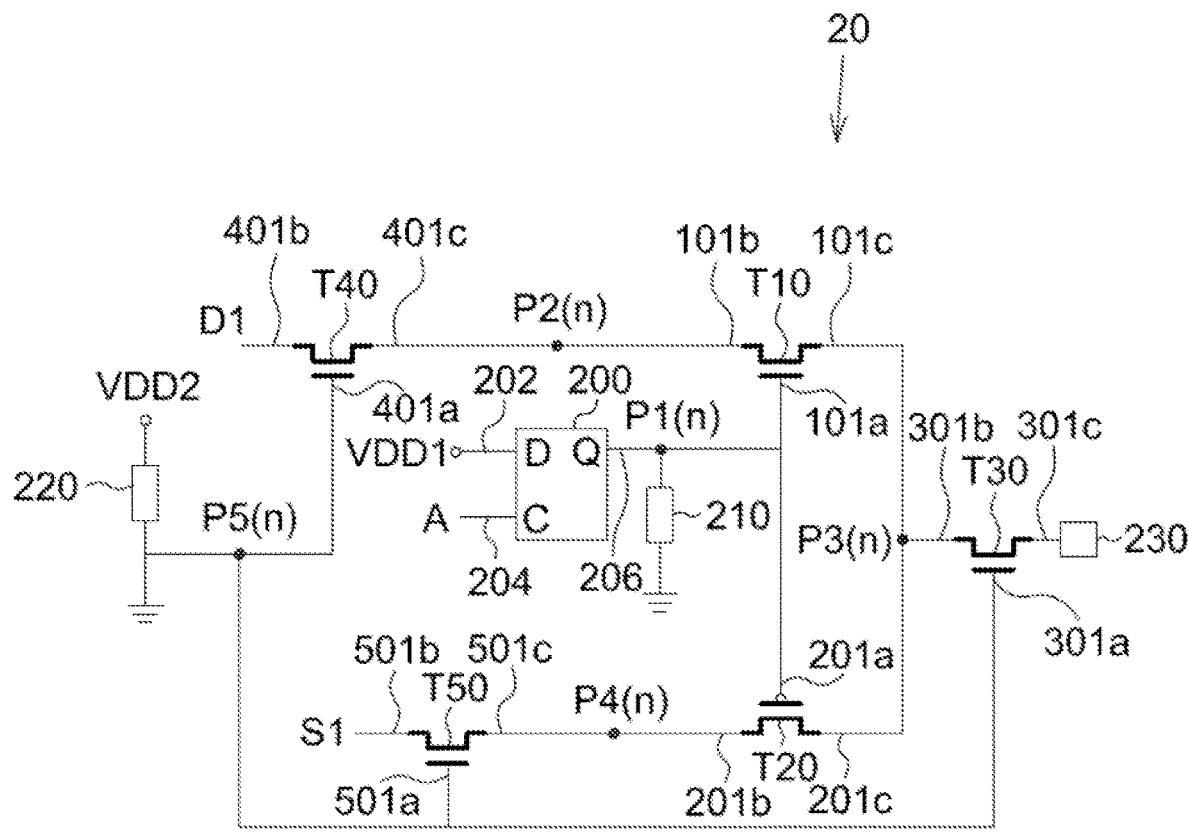
FIG. 2 is a schematic diagram of a measurement signal circuit according to an embodiment of this application.

FIG. 2 is a schematic diagram of a measurement signal circuit according to an embodiment of this application. Referring to FIG. 2, in an embodiment of this application, a measurement signal circuit 20 is provided, including: a first switch T10, a control end 101a of the first switch T10 being electrically coupled to a first node P1(n), a first end 101b of the first switch T10 being electrically coupled to a second node P2(n), and a second end 101c of the first switch T10 being electrically coupled to a third node P3(n); a second switch T20, a control end 201a of the second switch T20 being electrically coupled to the first node P1(n), a first end 201b of the second switch T20 being electrically coupled to a fourth node P4(n), and a second end 201c of the second switch T20 being electrically coupled to the third node P3(n): and a third switch T30, a control end 301a of the third switch T30 being electrically coupled to a fifth node P5(n), a first end 301b of the third switch T30 being electrically coupled to the third node P3(n), and a second end 301c of the third switch T30 being electrically coupled to a pad 230.

In one or more embodiments, the measurement signal circuit includes a fourth switch T40, a control end 401a of the fourth switch T40 being electrically coupled to the fifth node P5(n), a first end 401b of the fourth switch T40 being electrically coupled to a data line D1, and a second end 401c of the fourth switch T40 being electrically coupled to the second node P2(n).

In one or more embodiments, the measurement signal circuit includes a fifth switch T50, a control end 501a of the fifth switch T50 being electrically coupled to the fifth node P5(n), a first end 501b of the fifth switch T50 being electrically coupled to a scan line S1, and a second end 501c of the fifth switch T50 being electrically coupled to the fourth node P4(n).

In one or more embodiments, the measurement signal circuit includes a trigger 200, a first end 202 of the trigger 200 being electrically coupled to a first voltage signal VDD1, a second end 204 of the trigger 200 being electrically coupled to a frequency input signal A, and a third end 206 of the trigger 200 being electrically coupled to the first node P1(n).

In one or more embodiments, the measurement signal circuit includes a first resistor 210, one end of the first resistor 210 being electrically coupled to the first node P1(n), and the other end of the first resistor 210 being electrically grounded.

In one or more embodiments, the measurement signal circuit includes a second resistor 220, one end of the second resistor 220 being electrically coupled to a second voltage signal VDD2, and the other end of the second resistor 220 being electrically grounded.

Referring to FIG. 2, in an embodiment of this application, a measurement signal circuit 20 is provided, including: a first switch T10, a control end 101a of the first switch T10 being electrically coupled to a first node P1(n), a first end 101b of the first switch T10 being electrically coupled to a second node P2(n), and a second end 101c of the first switch T10 being electrically coupled to a third node P3(n); a second switch T20, a control end 201a of the second switch T20 being electrically coupled to the first node P1(n), a first end 201b of the second switch T20 being electrically coupled to a fourth node P4(n), and a second end 201c of the second switch T20 being electrically coupled to the third node P3(n); a third switch T30, a control end 301a of the third switch T30 being electrically coupled to a fifth node P5(n), a first end 301b of the third switch T30 being electrically coupled to the third node P3(n), and a second end 301c of the third switch T30 being electrically coupled to a pad 230; a fourth switch T40, a control end 401a of the fourth switch T40 being electrically coupled to the fifth node P5(n), a first end 401b of the fourth switch T40 being electrically coupled to a data line D1, and a second end 401c of the fourth switch T40 being electrically coupled to the second node P2(n); a fifth switch T50, a control end 501a of the fifth switch T50 being electrically coupled to the fifth node P5(n), a first end 501b of the fifth switch T50 being electrically coupled to a scan line S1, and a second end 501c of the fifth switch T50 being electrically coupled to the fourth node P4(n): a first resistor 210, one end of the first resistor 210 being electrically coupled to the first node P1(n), and the other end of the first resistor 210 being electrically grounded; and a second resistor 220, one end of the second resistor 220 being electrically coupled to a second voltage signal VDD2, and the other end of the second resistor 220 being electrically grounded, where the other end of the second resistor 220 is electrically coupled to the fifth node P5(n) if the other end is not electrically grounded.

In one or more embodiments, the first switch T10, the third switch T30, the fourth switch T40, and the fifth switch T50 are N-MOS, where a gate control signal thereof is at a high level, the first switch T10, the third switch T30, the fourth switch T40, and the fifth switch T50 are turned on, and when the gate control signal thereof is at a low level, the first switch T10, the third switch T30, the fourth switch T40, and the fifth switch T50 are turned off.

In one or more embodiments, the second switch T20 is P-MOS, where when a gate control signal thereof is at a low level, the second switch T20 is tuned on, and when the gate control signal thereof is at a high level, the second switch T20 is turned off.

FIG. 3 is a flowchart of a measurement method for a measurement signal circuit according to an embodiment of this application. Referring to FIG. 2 and FIG. 3, in an embodiment of this application, a measurement method for a measurement signal circuit 20 is provided, including:

providing a first switch T10, a control end 101a of the first switch T10 being electrically coupled to a first node P1(n), a first end 101b of the first switch T10 being electrically coupled to a second node P2(n), and a second end 101c of the first switch T10 being electrically coupled to a third node P3(n);

providing a second switch T20, a control end 201a of the second switch T20 being electrically coupled to the first node P1(n), a first end 201b of the second switch T20 being electrically coupled to a fourth node P4(n), and a second end 201c of the second switch T20 being electrically coupled to the third node P3(n);

providing a third switch T30, a control end 301a of the third switch T30 being electrically coupled to a fifth node P5(n), a first end 301b of the third switch T30 being electrically coupled to the third node P3(n), and a second end 301c of the third switch T30 being electrically coupled to a pad 230;

providing a fourth switch T40, a control end 401a of the fourth switch T40 being electrically coupled to the fifth node P5(n), a first end 401b of the fourth switch T40 being electrically coupled to a data line D1, and a second end 401c of the fourth switch T40 being electrically coupled to the second node P2(n);

providing a fifth switch T50, a control end 501a of the fifth switch T50 being electrically coupled to the fifth node P5(n), a first end 501b of the fifth switch T50 being electrically coupled to a scan line S1, and a second end 501c of the fifth switch T50 being electrically coupled to the fourth node P4(n);

providing a trigger 200, a first end 202 of the trigger 200 being electrically coupled to a first voltage signal VDD1, a second end 204 of the trigger 200 being electrically coupled to a frequency input signal A, and a third end 206 of the trigger 200 being electrically coupled to the first node P1(n);

providing a first resistor 210, one end of the first resistor 210 being electrically coupled to the first node P1(n), and the other end of the first resistor 210 being electrically grounded:

providing a second resistor 220, one end of the second resistor 220 being electrically coupled to a second voltage signal VDD2, and the other end of the second resistor 220 being electrically grounded;

measuring a waveform signal of the scan line S1 through a connection between the pad 230 and the scan line S1;

and measuring a waveform signal of the data line D1 through a connection between the pad 230 and the data line D1, where the other end of the second resistor 220 is electrically coupled to the fifth node P5(n) if the other end is not electrically grounded.

Referring to FIG. 2, in an embodiment of this application, in the measurement method, the step of measuring a waveform signal of the scan line S1 through a connection between the pad 230 and the scan line S1 includes:

cutting off the electrically grounded other end of the second resistor 220 by using a laser, and electrically coupling the other end of the second resistor 220 to the fifth node P5(n), so that a gate control signal of each of the third switch T30, the fourth switch T40, and the fifth switch T50 is a high-level signal, and the third switch T30, the fourth switch T40, and the fifth switch T50 are turned on;

grounding the first resistor 210, so that a gate control signal of each of the first switch T10 and the second switch T20 is a low-level signal, and the first switch T10 is turned off and the second switch T20 is turned on;

and measuring the waveform signal of the scan line S1 through the pad 230.

Referring to FIG. 2, in an embodiment of this application, in the measurement method, the step of measuring a waveform signal of the data line D1 through a connection between the pad 230 and the data line D1 includes:

transmitting a signal (for example, through a timing controller chip on a printed circuit board or an external signal) to the trigger 200, so that a gate control signal of each of the first switch T10 and the second switch T20 is a high-level signal, and the first switch T10 is turned on and the second switch T20 is turned off:

and measuring the waveform signal of the data line D1 through the pad 230.

Referring to FIG. 3, in a process S311, a first switch is provided, a control end of the first switch being electrically coupled to a first node, a first end of the first switch being electrically coupled to a second node, and a second end of the first switch being electrically coupled to a third node.

Referring to FIG. 3, in a process S312, a second switch is provided, a control end of the second switch being electrically coupled to the first node, a first end of the second switch being electrically coupled to a fourth node, and a second end of the second switch being electrically coupled to the third node.

Referring to FIG. 3, in a process S313, a third switch is provided, a control end of the third switch being electrically coupled to a fifth node, a first end of the third switch being electrically coupled to the third node, and a second end of the third switch being electrically coupled to a pad.

Referring to FIG. 3, in a process S314, a fourth switch is provided, a control end of the fourth switch being electrically coupled to the fifth node, a first end of the fourth switch being electrically coupled to a data line, and a second end of the fourth switch being electrically coupled to the second node.

Referring to FIG. 3, in a process S315, a fifth switch is provided, a control end of the fifth switch being electrically coupled to the fifth node, a first end of the fifth switch being electrically coupled to a scan line, and a second end of the fifth switch being electrically coupled to the fourth node.

Referring to FIG. 3, in a process S316, a trigger is provided, a first end of the trigger being electrically coupled to a first voltage signal, a second end of the trigger being electrically coupled to a frequency input signal, and a third end of the trigger being electrically coupled to the first node.

Referring to FIG. 3, in a process S317, a first resistor is provided, one end of the first resistor being electrically coupled to the first node, and the other end of the first resistor being electrically grounded.

Referring to FIG. 3, in a process S318, a second resistor is provided, one end of the second resistor being electrically coupled to a second voltage signal, and the other end of the second resistor being electrically grounded.

Referring to FIG. 3, in a process S319, a waveform signal of the scan line is measured through a connection between the pad and the scan line.

Referring to FIG. 3, in a process S320, a waveform signal of the data line is measured through a connection between the pad and the data line.

Referring to FIG. 3, in a process S321, the other end of the second resistor is electrically coupled to the fifth node if the other end is not electrically grounded.

This application provides a circuit and a measurement method that can quickly measure required signals as required without affecting product performance. In addition, additional device costs are not increased, and damage to the human body during glass breaking is eliminated.

Terms such as "in some embodiments" and "in various embodiments" are repeatedly used. The terms generally does not refer to the same embodiment, but may also refer to the same embodiment. Terms such as "comprise", "have", and "include" are synonymous, unless the context indicates other meanings.

The above descriptions are merely embodiments of this application, and do not limit this application in any form. Although this application is disclosed as above with specific embodiments, the embodiments are not intended to limit this application. A person of ordinary skill in the art may make some changes or modify the embodiments into equivalent embodiments with equivalent changes by using the disclosed content without departing from the scope of the technical solution of this application. Any simple modifications, equivalent changes and modifications made for the above embodiments according to the technical essence of this application without departing from the content of the technical solution of this application, still fall within the scope of the technical solution of this application.

What is claimed is:

1. A measurement signal circuit, comprising:
a first switch, a control end of the first switch being electrically coupled to a first node, a first end of the first switch being electrically coupled to a second node, and a second end of the first switch being electrically coupled to a third node;

a second switch, a control end of the second switch being electrically coupled to the first node, a first end of the second switch being electrically coupled to a fourth node, and a second end of the second switch being electrically coupled to the third node;

a third switch, a control end of the third switch being electrically coupled to a fifth node, a first end of the third switch being electrically coupled to the third node, and a second end of the third switch being electrically coupled to a pad; and a trigger, a first end of the trigger being electrically coupled to a first voltage signal, a second end of the trigger being electrically coupled to a frequency input signal, and a third end of the trigger being electrically coupled to the first node.

2. The measurement signal circuit according to claim 1, comprising a fourth switch, a control end of the fourth switch being electrically coupled to the fifth node, a first end of the fourth switch being electrically coupled to a data line, and a second end of the fourth switch being electrically coupled to the second node.

3. The measurement signal circuit according to claim 1, comprising a fifth switch, a control end of the fifth switch being electrically coupled to the fifth node, a first end of the fifth switch being electrically coupled to a scan line, and a second end of the fifth switch being electrically coupled to the fourth node.

4. The measurement signal circuit according to claim 1, comprising a first resistor, one end of the first resistor being electrically coupled to the first node, and the other end of the first resistor being electrically grounded.

5. A measurement signal circuit, comprising:
a first switch, a control end of the first switch being electrically coupled to a first node, a first end of the first switch being electrically coupled to a second node, and a second end of the first switch being electrically coupled to a third node;
a second switch, a control end of the second switch being electrically coupled to the first node, a first end of the second switch being electrically coupled to a fourth node, and a second end of the second switch being electrically coupled to the third node;
a third switch, a control end of the third switch being electrically coupled to a fifth node, a first end of the third switch being electrically coupled to the third node, and a second end of the third switch being electrically coupled to a pad;
a fourth switch, a control end of the fourth switch being electrically coupled to the fifth node, a first end of the fourth switch being electrically coupled to a data line, and a second end of the fourth switch being electrically coupled to the second node;
a fifth switch, a control end of the fifth switch being electrically coupled to the fifth node, a first end of the fifth switch being electrically coupled to a scan line, and a second end of the fifth switch being electrically coupled to the fourth node;
a first resistor, one end of the first resistor being electrically coupled to the first node, and the other end of the first resistor being electrically grounded;
a second resistor, one end of the second resistor being electrically coupled to a second voltage signal, and the other end of the second resistor being electrically grounded, wherein the other end of the second resistor is electrically coupled to the fifth node in a case where the other end is not electrically grounded; and
a trigger, a first end of the trigger being electrically coupled to a first voltage signal, a second end of the trigger being electrically coupled to a frequency input signal, and a third end of the trigger being electrically coupled to the first node.

6. The measurement signal circuit according to claim 5, wherein a waveform signal of the scan line is measured through a connection between the pad and the scan line.

7. The measurement signal circuit according to claim 6, wherein during the measuring a waveform signal of the scan line, the waveform signal of the scan line is measured through the pad.

8. The measurement signal circuit according to claim 5, wherein a waveform signal of the data line is measured through a connection between the pad and the data line.

9. The measurement signal circuit according to claim 8, wherein during the measuring a waveform signal of the data line, the waveform signal of the data line is measured through the pad.

10. A measurement method for a measurement signal circuit, comprising:
providing a first switch, a control end of the first switch being electrically coupled to a first node, a first end of the first switch being electrically coupled to a second node, and a second end of the first switch being electrically coupled to a third node;
providing a second switch, a control end of the second switch being electrically coupled to the first node, a first end of the second switch being electrically coupled to a fourth node, and a second end of the second switch being electrically coupled to the third node;
providing a third switch, a control end of the third switch being electrically coupled to a fifth node, a first end of the third switch being electrically coupled to the third node, and a second end of the third switch being electrically coupled to a pad;
providing a fourth switch, a control end of the fourth switch being electrically coupled to the fifth node, a first end of the fourth switch being electrically coupled to a data line, and a second end of the fourth switch being electrically coupled to the second node;
providing a fifth switch, a control end of the fifth switch being electrically coupled to the fifth node, a first end of the fifth switch being electrically coupled to a scan line, and a second end of the fifth switch being electrically coupled to the fourth node;
providing a trigger, a first end of the trigger being electrically coupled to a first voltage signal, a second end of the trigger being electrically coupled to a frequency input signal, and a third end of the trigger being electrically coupled to the first node;
providing a first resistor, one end of the first resistor being electrically coupled to the first node, and the other end of the first resistor being electrically grounded;
providing a second resistor, one end of the second resistor being electrically coupled to a second voltage signal, and the other end of the second resistor being electrically grounded;
measuring a waveform signal of the scan line through a connection between the pad and the scan line; and
measuring a waveform signal of the data line through a connection between the pad and the data line, wherein the other end of the second resistor is electrically coupled to the fifth node in a case where the other end is not electrically grounded;

wherein the measuring a waveform signal of the scan line through a connection between the pad and the scan line comprises:
cutting off the electrically grounded other end of the second resistor by using a laser, and electrically coupling the other end of the second resistor to the fifth node, so that a gate control signal of each of the third switch, the fourth switch, and the fifth switch is a high-level signal, and the third switch, the fourth switch, and the fifth switch are turned on;
grounding the first resistor, so that a gate control signal of each of the first switch and the second switch is a low-level signal, and the first switch is turned off and the second switch is turned on; and
measuring the waveform signal of the scan line through the pad.

11. The measurement method for a measurement signal circuit according to claim 10, wherein the step of measuring a waveform signal of the data line through a connection between the pad and the data line comprises:
transmitting a signal to the trigger, so that a gate control signal of each of the first switch and the second switch is a high-level signal, and the first switch is turned on and the second switch is turned off; and
measuring the waveform signal of the data line through the pad.

* * * * *